US012733381B2

(12) United States Patent
Park

(10) Patent No.: US 12,733,381 B2
(45) Date of Patent: Sep. 8, 2026

(54) PIXEL AND VIEWING ANGLE CONTROL DISPLAY DEVICE INCLUDING THE SAME

(71) Applicant: LG Display Co., Ltd., Seoul (KR)

(72) Inventor: Jaehyun Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 357 days.

(21) Appl. No.: 18/366,223

(22) Filed: Aug. 7, 2023

(65) Prior Publication Data

US 2024/0114753 A1 Apr. 4, 2024

(30) Foreign Application Priority Data

Oct. 4, 2022 (KR) ........................ 10-2022-0126468

(51) Int. Cl.
*H10K 59/80* (2023.01)
*H10K 59/12* (2023.01)

(52) U.S. Cl.
CPC ..... *H10K 59/876* (2023.02); *H10K 59/80518* (2023.02); *H10K 59/873* (2023.02); *H10K 59/12* (2023.02)

(58) Field of Classification Search
None
See application file for complete search history.

(56) References Cited

U.S. PATENT DOCUMENTS

2013/0099210 A1* 4/2013 Ikeda .................. H10K 50/856 257/E51.019
2021/0036263 A1* 2/2021 Kim .................... H10K 59/878
2021/0193968 A1 6/2021 Lee et al.
2022/0077431 A1 3/2022 Lee et al.
2022/0223824 A1* 7/2022 You ..................... H10K 59/879

FOREIGN PATENT DOCUMENTS

JP 2013-101927 A 5/2013
KR 10-2021-0078802 A 6/2021
KR 10-2022-0033770 A 3/2022
KR 10-2022-0102177 A 7/2022

OTHER PUBLICATIONS

Ministry of Intellectual Property of Korea, Office Action, Korean Patent Application No. 10-2022-0126468, Dec. 9, 2025, 15 pages.

* cited by examiner

*Primary Examiner* — Daniel Whalen
(74) *Attorney, Agent, or Firm* — Fenwick & West LLP

(57) ABSTRACT

Embodiments relate to a pixel and a viewing angle control display device including the pixel, the pixel including a thin film transistor (TFT) array layer disposed on a substrate and including circuit elements, a light emitting element layer disposed on the TFT array layer and including a first electrode layer, a second electrode layer, and a light emitting layer interposed between the first electrode layer and the second electrode layer, and a reflective layer disposed on the light emitting element layer and including a plurality of apertures, wherein the light emitting layer generates light, which is guided by the reflective layer to be emitted through the plurality of apertures.

12 Claims, 13 Drawing Sheets

PIXEL AND VIEWING ANGLE CONTROL DISPLAY DEVICE INCLUDING THE SAME

CROSS REFERENCE TO RELATED APPLICATION

The present application claims priority to Republic of Korea Patent Application No. 10-2022-0126468, filed on Oct. 4, 2022, which is hereby incorporated by reference in its entirety.

BACKGROUND

Field of Technology

The present invention relates to a pixel and viewing angle control display device including the pixel.

Description of the Related Art

Typically, electronic devices such as monitors, televisions (TVs), laptops, and digital cameras are equipped with a display device for rendering images. A display device includes a plurality of pixels. Each pixel can emit light representing a specific color. For example, each pixel may include a light emitting element. The light emitting element may include a light emitting layer located between two electrodes.

A display device may control the viewing angle to prevent the image displayed to the user from being perceived by others around. For example, a display device may restrict the direction of light emitted from each pixel of the display panel by attaching a light control film (LCF) on the display panel rendering images.

However, such a display device may experience a significant increase in the overall thickness and a decrease in the central luminance of each pixel due to the light control film.

SUMMARY

The present disclosure relates to a pixel capable of controlling the viewing angle and a viewing angle control display device including the pixel.

The present disclosure relates to a pixel including a reflective layer formed to have apertures between a light emitting element and a pixel lens to control the viewing angle and a viewing angle control display device including the pixel.

A pixel according to an embodiment may include a thin film transistor (TFT) array layer disposed on a substrate and including circuit elements, a light emitting element layer disposed on the TFT array layer and including a first electrode layer, a second electrode layer, and a light emitting layer interposed between the first electrode layer and the second electrode layer, and a reflective layer disposed on the light emitting element layer and including a plurality of apertures, wherein the light emitting layer may generate light, which may be guided by the reflective layer to be emitted through the plurality of apertures.

The first electrode layer may include a reflective electrode, the second electrode layer include a transparent electrode, and the light may be guided between the first electrode layer and the reflective layer and emitted through the plurality of apertures.

The pixel may further include a lower reflective layer disposed beneath the substrate, wherein the first electrode layer and the second electrode layer may include a transparent electrode, and the light may be guided between the lower reflective layer and the reflective layer and emitted through the plurality of apertures.

The pixel may further include a thin film encapsulation layer interposed between the light emitting element layer and the reflective layer and including an inorganic thin film or an organic thin film.

The thin film encapsulation layer may include a first thin film including an inorganic material or an organic material and a second thin film formed on the first thin film and including a polymer.

The plurality of apertures may be less in area than the pixel.

A viewing angle control display device according to an embodiment may include a substrate, a plurality of pixels formed on the substrate, and a lens assembly disposed on the pixels and including a plurality of pixel lenses.

Each of the plurality of pixels may include a thin film transistor (TFT) array layer disposed on a substrate and including circuit elements, a light emitting element layer disposed on the TFT array layer and including a first electrode layer, a second electrode layer, and a light emitting layer interposed between the first electrode layer and the second electrode layer, and a reflective layer disposed on the light emitting element layer and including a plurality of apertures, wherein the light emitting layer generates light, which may be guided by the reflective layer to be emitted through the plurality of apertures.

The plurality of apertures may be less in area than the plurality of pixel lenses and overlap the plurality of pixel lens at least partly or entirely, and each of the plurality of pixel lenses may be less in area than the plurality of pixels.

The first electrode layer may include a reflective electrode, the second electrode layer may include a transparent electrode, and the light may be guided between the first electrode layer and the reflective layer and emitted through the plurality of apertures.

The viewing angle control display device may further include a lower reflective layer disposed beneath the substrate, wherein the first electrode layer and the second electrode layer may include a transparent electrode, and the light may be guided between the lower reflective layer and the reflective layer and emitted through the plurality of apertures.

The viewing angle control display device may further include a thin film encapsulation layer interposed between the light emitting element layer and the reflective layer and including an inorganic thin film or an organic thin film, and a passivation layer interposed between the lens assembly and the reflective layer.

The passivation layer may include a multilayer including at least one of an inorganic thin film and an organic thin film.

The apertures may have a first diameter, the pixel lenses may have a second diameter, and a first distance between a top surface of the substrate and the reflective layer and a second distance between the reflective layer and a bottom surface of the lens assembly may have a relationship of Equation 1:

$$G2?\alpha\times(W2+W1)/2$$

where $\alpha$ is an arbitrary number greater than or equal to 0.2, W1 is the first diameter, W2 is the second diameter, G2 is the second distance.

The reflective layer may include a first reflective layer patterned in a predetermined shape with first apertures, a second reflective layer formed on the first reflective layer and patterned in a predetermined shape with second apertures, and a bridge electrically connecting the first reflective layer and the second reflective layer.

The first reflective layer may be patterned, at one region thereof, in a bar shape elongated in one direction, and the second reflective layer may be patterned, at one region thereof, in a bar shape elongated in another direction perpendicular to the one direction.

The first reflective layer and the second reflective layer may be disposed to overlap at least partly each other and configured to sense touch based on capacitance formed between the adjacent first reflective layers and the adjacent second reflective layers.

The substrate may include a privacy area and a share area including at least one pixel, and the plurality of pixel lenses may be hemispherical in shape in the privacy area to reflect and emit incident light upward and pyramidical in shape in the share area to disperse and emit the incident light.

The privacy area may be configured to open a viewing angle to front and limit to sides via the pixel lens based on the at least one pixel emitting light in the privacy area, and the share area may be configured to open the viewing angle to both the front and sides via the pixel lenses based on the at least one pixel emitting light in the share area.

One of the at least one pixel of the privacy area and the at least one pixel of the share area may be selectively driven to operate a privacy mode and a share mode.

A pixel according to an embodiment may include a thin film transistor TFT array layer disposed on a substrate and comprising circuit elements; a light emitting element layer disposed on the TFT array layer and comprising a first electrode layer, a second electrode layer, and a light emitting layer interposed between the first electrode layer and the second electrode layer; and a reflective layer disposed on the light emitting element layer and comprising a plurality of apertures, wherein the light emitting layer generates light, which is guided by the reflective layer to be emitted through the plurality of apertures, and wherein the reflective layer comprises: a first reflective layer patterned in a predetermined shape with first apertures; a second reflective layer formed on the first reflective layer and patterned in a predetermined shape with second apertures; and a bridge electrically connecting the first reflective layer and the second reflective layer.

DETAILED DESCRIPTION

Figure 1:
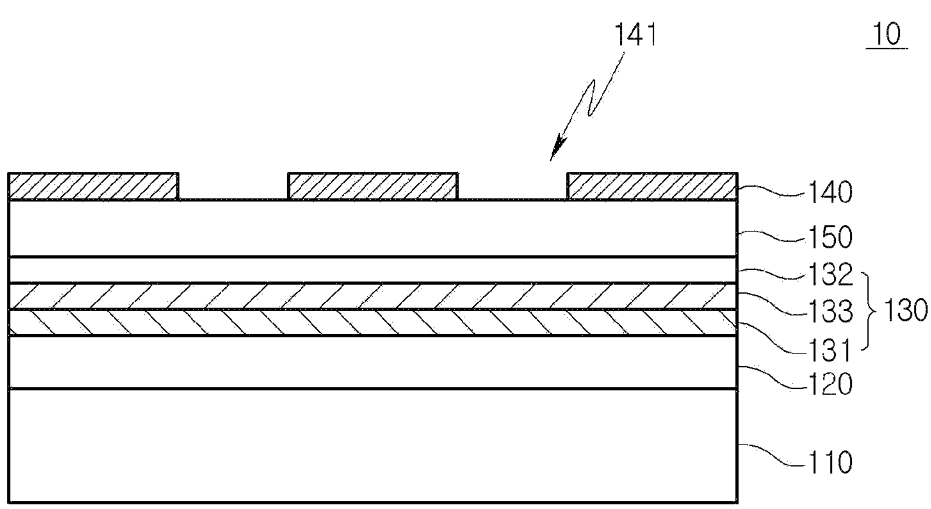
FIG. 1 is a cross-sectional view of a pixel according to a first embodiment.

Hereinafter, embodiments will be described with reference to accompanying drawings. In the specification, when a component (or area, layer, part, etc.) is mentioned as being "on top of," "connected to," or "coupled to" another component, it means that it may be directly connected/coupled to the other component, or a third component may be placed between them.

The same reference numerals refer to the same components. In addition, in the drawings, the thickness, proportions, and dimensions of the components are exaggerated for effective description of the technical content. The expression "and/or" is taken to include one or more combinations that can be defined by associated components.

The terms "first," "second," etc. are used to describe various components, but the components should not be limited by these terms. The terms are used only for distinguishing one component from another component. For example, a first component may be referred to as a second component and, similarly, the second component may be referred to as the first component, without departing from the scope of the present invention. As used herein, the singular forms are intended to include the plural forms as well, unless the context clearly indicates otherwise.

The terms such as "below," "lower," "above," "upper," etc. are used to describe the relationship of components depicted in the drawings. The terms are relative concepts and are described based on the direction indicated on the drawing.

It will be further understood that the terms "comprises," "has," and the like are intended to specify the presence of stated features, numbers, steps, operations, components, parts, or a combination thereof but are not intended to preclude the presence or possibility of one or more other features, numbers, steps, operations, components, parts, or combinations thereof.

Figure 2:
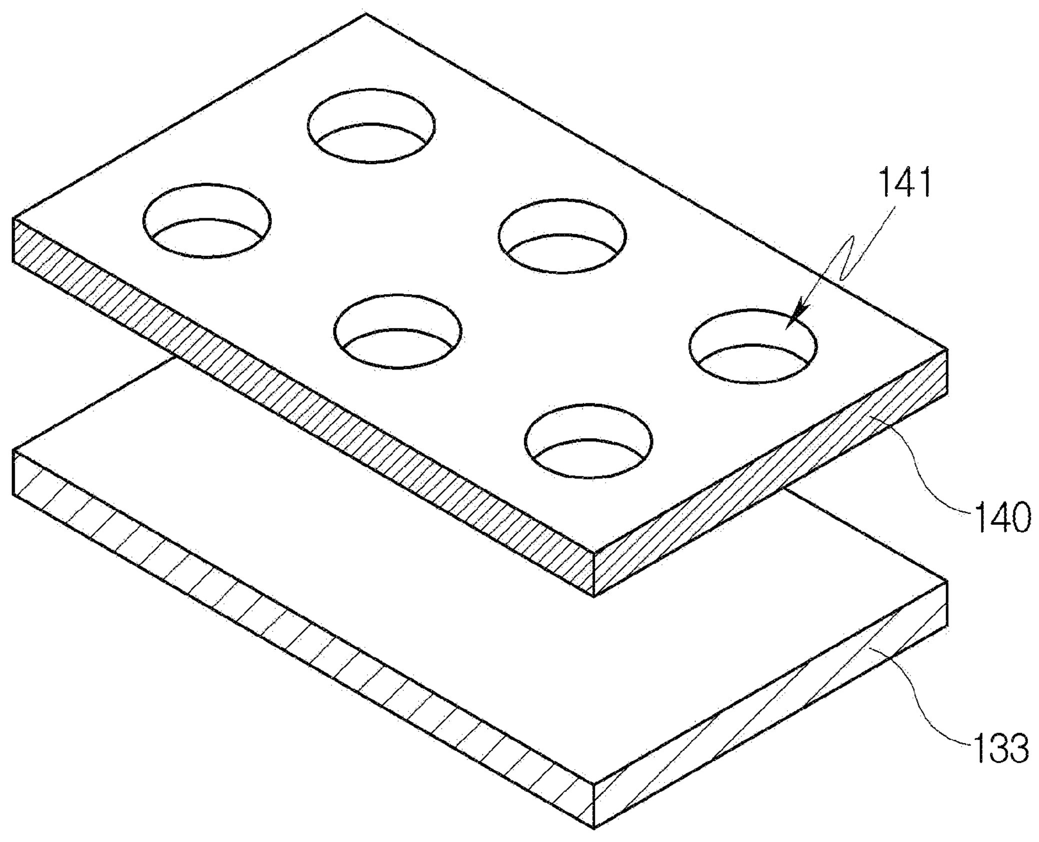
FIG. 2 is a perspective view illustrating the reflective layer and the light emitting layer of FIG. 1 according to one embodiment.
Figure 3:
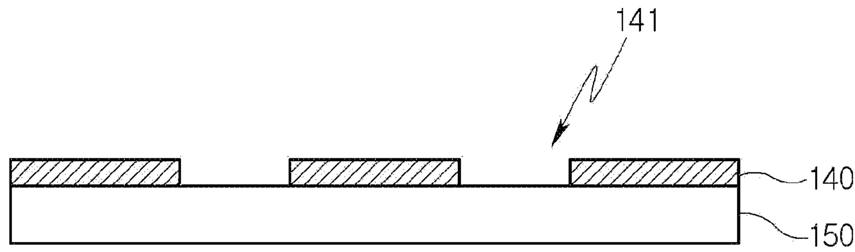
FIG. 3 and FIG. 4 are cross-sectional views of the encapsulation layer of FIG. 1 according to one embodiment.
Figure 4:
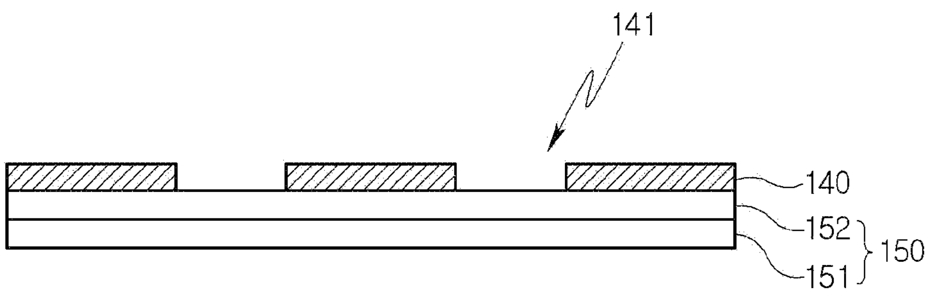

FIG. 1 is a cross-sectional view of a pixel according to a first embodiment. FIG. 2 is a perspective view illustrating the reflective layer and the light emitting layer of FIG. 1 according to one embodiment. FIG. 3 and FIG. 4 are cross-sectional views of the encapsulation layer of FIG. 1 according to one embodiment.

With reference to FIGS. 1 and 2, a pixel 10 according to the first embodiment is formed on a substrate 110 and includes a thin film transistor (TFT) array layer 120, a light emitting element layer 130, and a reflective layer 140.

The substrate 110 may be a transparent substrate and serve as a base material of the pixel 10. The substrate 110 may be a rigid substrate including glass or tempered glass or a flexible substrate made of a plastic material. For example, the substrate 110 may be a flexible polymer film made of one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC), polyvinyl alcohol (PVA), Polyimide (PI), and polystyrene (PS). However, the material of the substrate 110 is not limited to the above materials.

The TFT array layer 120 is formed on the substrate 110. The TFT array layer 120 may include a drive transistor for controlling drive current to be supplied to the light emitting element layer 130 to be described later, at least one switching transistor, and at least one capacitor.

The light emitting element layer 130 is formed on the TFT array layer 120. The light emitting element layer 130 may include a first electrode layer 131, a second electrode layer 132, and a light emitting layer 133 interposed therebetween.

At least one of the first electrode layer 131 and the second electrode layer 132 may be composed of a transparent electrode, and the other may be composed of a reflective electrode. For example, when the light emitting element layer 130 is a front-emitting type, the first electrode layer 131 may be formed as a reflective electrode, and the second electrode layer 132 may be formed as a transparent electrode. Meanwhile, when the light emitting element layer 130 is a rear-emitting type, the first electrode layer 131 may be formed as a transparent electrode, and the second electrode layer 132 may be formed as a reflective electrode. In another embodiment, when the light emitting element layer 130 is double-sided light emitting type, both the first electrode layer 131 and the second electrode layer 132 may be configured as transparent electrodes. Particularly in this embodiment, the first electrode layer 131 is composed of a reflective electrode, and the second electrode layer 132 is composed of a transparent electrode. In an embodiment, the first electrode layer 131 is an anode electrode layer, and the second electrode layer 132 is a cathode electrode layer, but this is not limited thereto.

The first electrode layer 131 may be composed of a transparent conductive material such as indium tin oxide (ITO), indium zinc oxide (IZO), or zinc oxide (ZnO). Here, the first electrode layer 131 may be composed of a reflective electrode and include a reflective layer. The reflective layer may be made of aluminum (Al), copper (Cu), silver (Ag), nickel (Ni), or alloys thereof. In an embodiment, the reflective layer may be composed of an alloy of silver (Ag), palladium (Pd), and copper (Cu) (APC).

The light emitting layer 133 is formed on the first electrode layer 131.

The light emitting layer 133 may have a multilayer thin film structure including a light generation layer. For example, the light emitting layer 133 may include a hole transport layer (HTL), an organic light emitting layer, and an electron transport layer (ETL). The hole transport layer serves to smoothly transport holes injected from the first electrode layer 131 to the organic light emitting layer. The organic light emitting layer may be formed of organic material containing phosphorescent or fluorescent material. The electron transport layer serves to smoothly transport electrons injected from the second electrode layer 132 to the organic light emitting layer. The light emitting layer 133 may include a hole injection layer (HIL), a hole blocking layer (HBL), an electron injection layer (EIL), and an electron blocking layer (EBL), in addition to the hole transport layer, organic light emitting layer, and electron transport layer.

The light emitting layer 133 may be formed in a tandem structure of two or more stacks. In this case, each stack may include a hole transport layer, an organic light emitting layer, and an electron transport layer. When the light emitting layer 133 is formed in a tandem structure of two or more stacks, a charge generation layer may be formed between the stacks. The charge generation layer may include an n-type charge generation layer formed adjacent to the lower stack and a p-type charge generation layer formed adjacent to the upper stack. The n-type charge generation layer injects electrons into the lower stack, and the p-type charge generation layer injects holes into the upper stack. The n-type charge generation layer may be an organic layer doped with alkali metals such as lithium (Li), sodium (Na), potassium (K), or cesium (Cs), or alkaline earth metals such as magnesium (Mg), strontium (Sr), barium (Ba), or radium (Ra), which have electron transport capability. The p-type charge generation layer may be an organic layer doped with dopants in an organic host material with hole transport ability.

The color of light generated from the light generation layer may be red, green, or blue, but the present invention is not limited thereby. For example, the color of light generated from the light emitting layer 133 may be one of magenta, cyan, and yellow, or white.

The second electrode layer 132 is formed on the light emitting layer 133. The second electrode layer 132 may be formed of a transparent conductive material (TCO) or a semi-transmissive conductive material such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof, that are capable of transmitting light. When the second electrode layer 132 is formed of a semi-transmissive conductive material, the luminous efficiency may be improved by micro-cavities.

A reflective layer 140 is formed on the light emitting element layer 130. The reflective layer 140 may be formed in a single-layer or multi-layer structure made of a metal having high optical reflectance to be capable of reflecting light, such as molybdenum (Mo), aluminum (Al), chromium (Cr), gold (Au), titanium (Ti), nickel (Ni), neodymium (Nd), copper (Cu), or alloys thereof.

The reflective layer 140 may include a plurality of apertures 141. The apertures 141 may be formed at predetermined intervals in the reflective layer 140. Although they may have a circular shape as illustrated, the apertures 141 may have various shapes such as an oval, a triangle, a rectangle, and a polygon in various embodiments.

In an embodiment, an aperture 141 may have a smaller area than a single pixel 10 and may be arranged such that a portion or the entire area of the aperture overlaps the pixel 10.

A thin film encapsulation layer 150 may be interposed between the light emitting element layer 130 and the reflective layer 140. The thin film encapsulation layer 150 may be composed of a transparent insulating material and serves as an insulating film to protect the underlying components. In an embodiment, the thin film encapsulation layer 150 may be composed of a single layer of an inorganic or organic thin film such as silicon oxide (SiOx) and silicon nitride (SiNx) as shown in FIG. 3. In another embodiment, the thin film encapsulation layer 150 may be formed as a multilayer structure composed of a first thin film 151 including inorganic or organic material and a second thin film 152 made of polymers such as polyimide, polyamide, polyethylene terephthalate, polymethyl methacrylate, polypropylene glycol, polycarbonate, and the like, as shown in FIG. 4. The thin film encapsulation layer 150 is not limited in material to those aforementioned.

Figure 5:
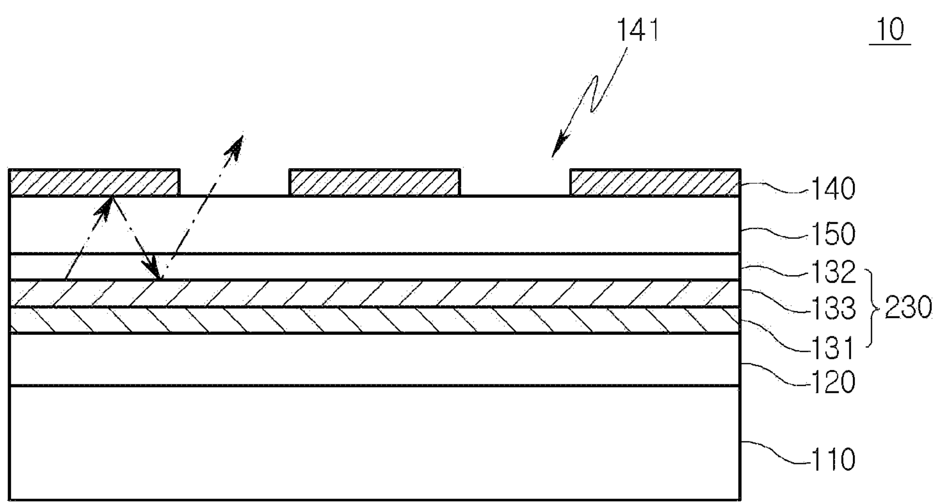
FIG. 5 is a diagram for explaining a light path in a pixel according to the first embodiment.

FIG. 5 is a diagram for explaining a light path in a pixel according to the first embodiment.

With reference to FIG. 5, in the pixel 10 according to the first embodiment, the first electrode layer 131 is composed of a reflective electrode, and the second electrode layer 132 is composed of a transparent electrode. The light generated from the light emitting layer 133 of the pixel 10 transmits through the second electrode layer 132 composed of the transparent electrode and the thin film encapsulation layer 150 and travels upward.

Some of the light that has traveled upward is emitted through the apertures 141 of the reflective layer 140.

The remaining portion of the light that has traveled upward is reflected by the reflective layer 140 and returns downward. The returned downward light may be reflected again upward by the second electrode layer 132. As such, some of the light generated from the light emitting layer 133 is guided toward the apertures 141 by being reflected vertically between the reflective layer 140 and the second electrode layer 132. The guided light is emitted through the apertures 141.

In this manner, the light generated from the light emitting layer 133 is guided by the reflective layer 140 and emitted through the apertures 141. That is, the pixel 10 is implemented as a light-guiding pixel via the reflective layer 140.

In such light-guiding pixel, it is not necessary for the pixel 10 and the apertures 141 to be aligned precisely during the manufacturing process. This allows the alignment process to be omitted, simplifying the manufacturing process and reducing manufacturing costs.

Figure 6:
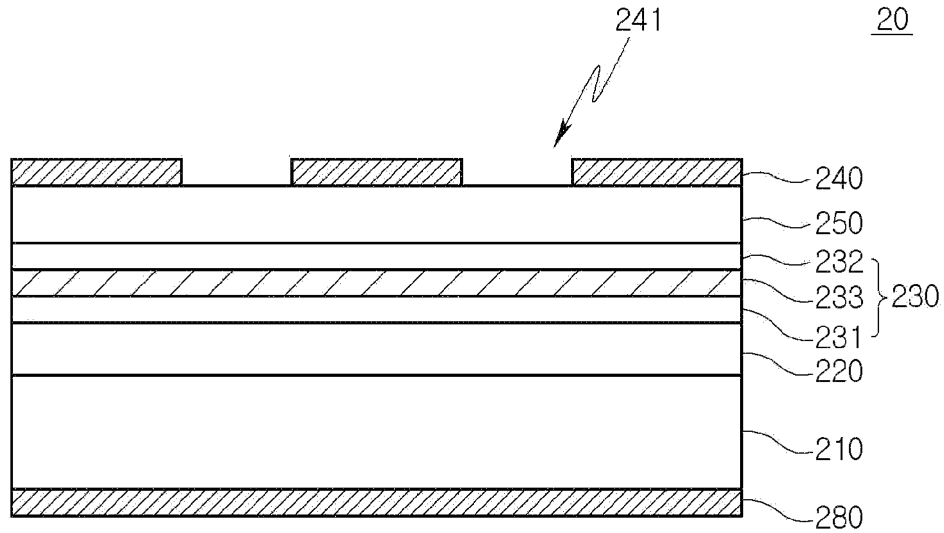
FIG. 6 is a cross-sectional view of a pixel according to a second embodiment.
Figure 7:
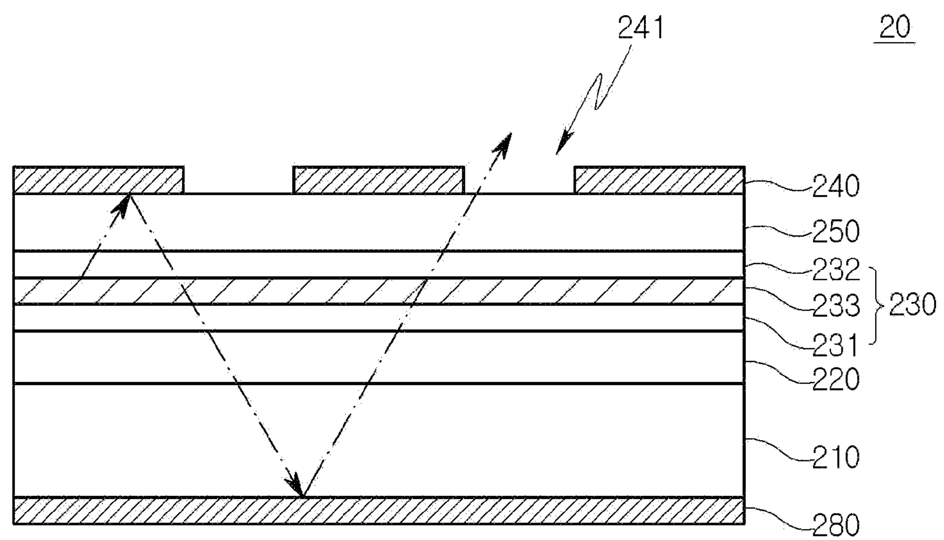
FIG. 7 is a diagram for explaining a light path in a display device according to the second embodiment.

FIG. 6 is a cross-sectional view of a pixel according to a second embodiment. FIG. 7 is a diagram for explaining a light path in a display device according to the second embodiment.

In describing the pixel 20 according to the second embodiment, detailed descriptions of the components identical to or overlapping those of the pixel 10 of the first embodiment described with reference to FIGS. 1 to 5 are omitted.

With reference to FIGS. 6 and 7, the pixel 20 according to the second embodiment may include a substrate 210, a TFT array layer 220, a light emitting element layer 230, a reflective layer 240, and a lower reflective layer 280.

In the second embodiment, the light emitting element layer 230 may include a first electrode layer 231, a second electrode layer 232, and a light emitting layer 233 interposed therebetween. Here, both the first and second electrode layers 231 and 232 are composed of transparent electrodes.

Accordingly, the light generated from the light emitting layer 233 of the pixel 20 is transmitted through the first electrode layer 231 and the second electrode layer 232, and travels upward and downward.

The lower reflective layer 280 is formed on the bottom surface of the substrate 210. The lower reflective layer 280 may be composed of the same material as the reflective layer 240. In another embodiment, the lower reflective layer 280 may be disposed between the substrate 210 and the first electrode layer 231 or in various layers below the light emitting element layer 230.

Some of the light that has traveled upward is emitted through the apertures 241 of the reflective layer 240.

The remaining portion of the light that has traveled upward is reflected by the reflective layer 240 and returns downward. The reflected downward light may be reflected again upward by the lower reflective layer 280. As such, some of the light generated from the light emitting layer 233 is guided toward the apertures 241 by being reflected vertically between the reflective layer 240 and the lower reflective layer 280. The guided light is emitted through the aperture 241 by passing through the aperture 241.

Figure 8:
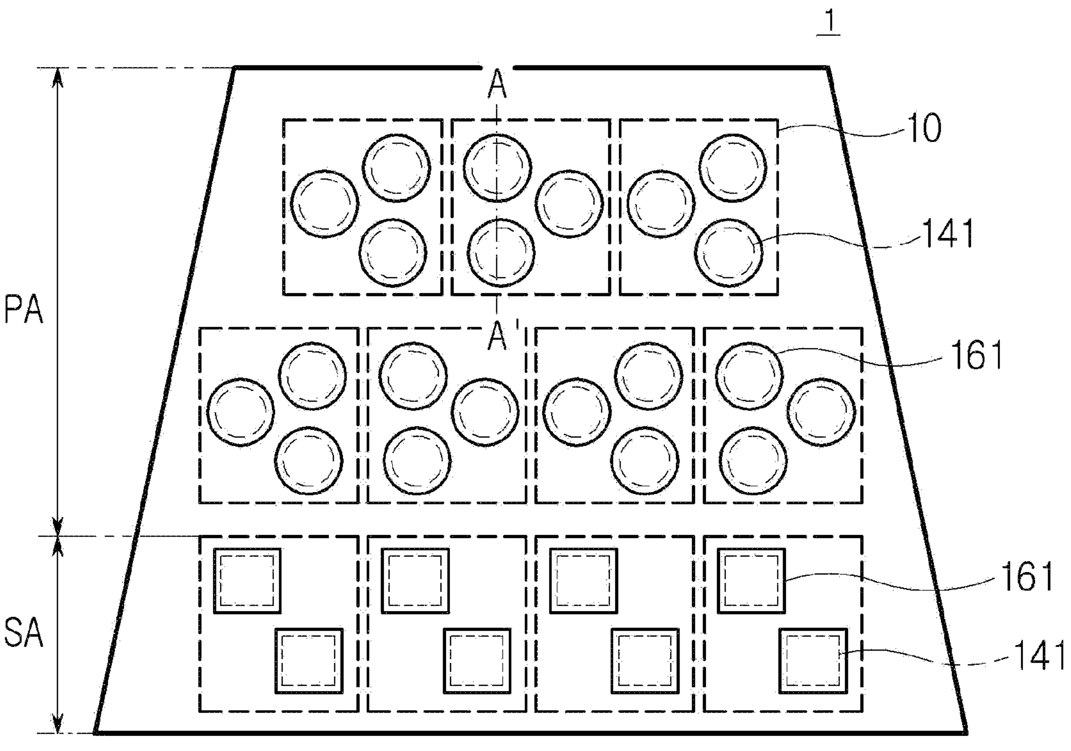
FIG. 8 is a plan view of a display device according to the first embodiment.
Figure 9:
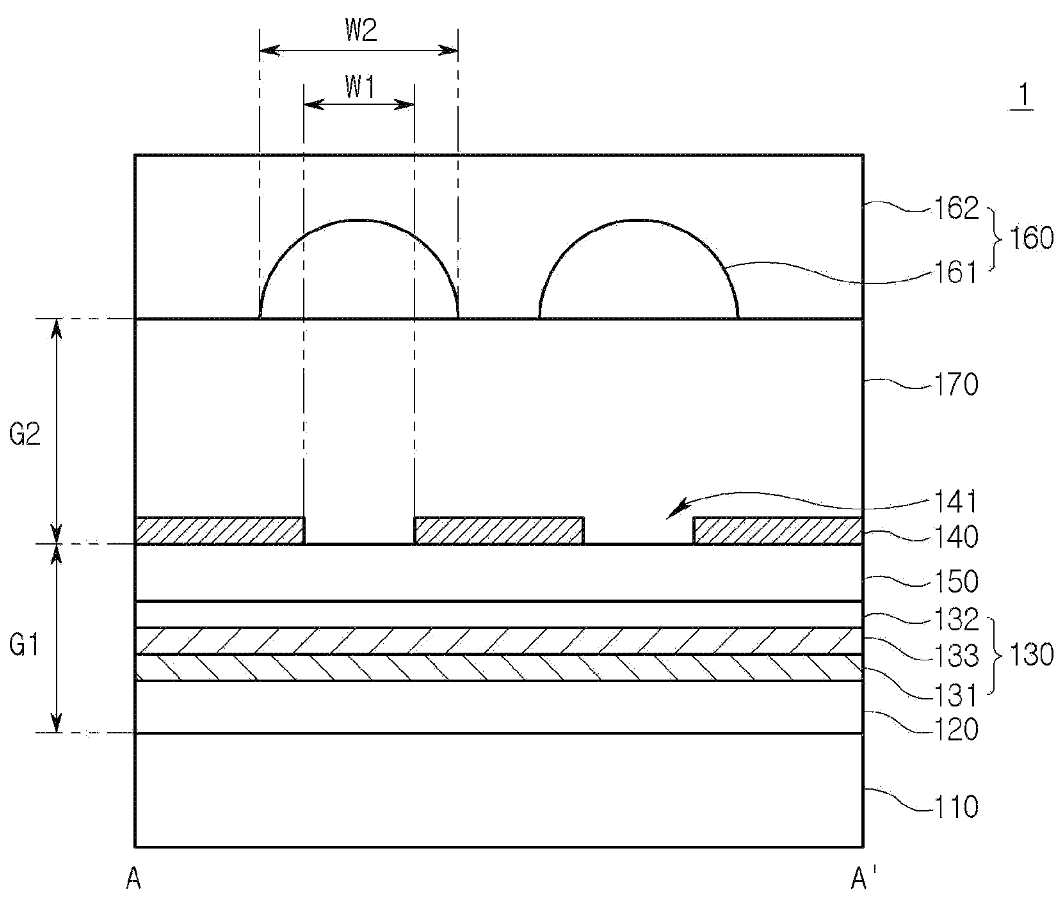
FIG. 9 is a cross-sectional view taken along line A-A' of FIG. 8 according to one embodiment.
Figure 10:
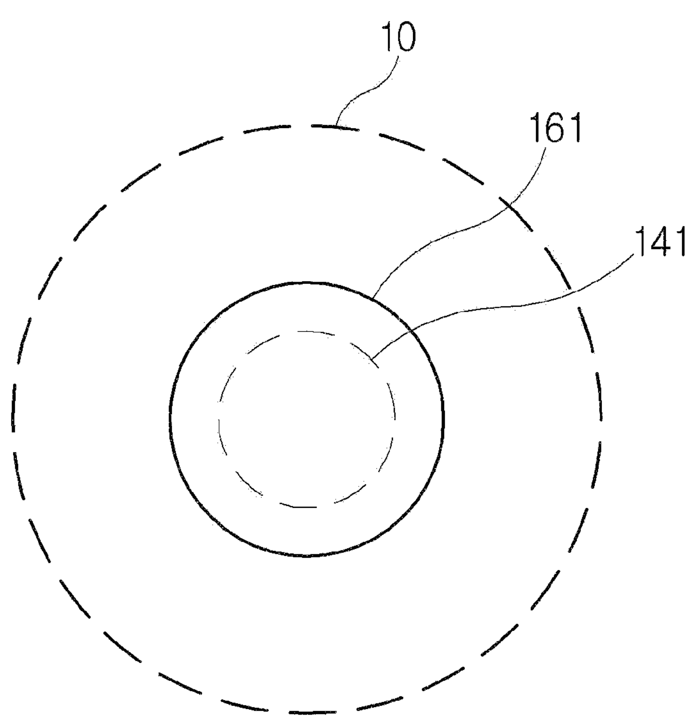
FIG. 10 is a plan view illustrating an arrangement of a pixel, an aperture, and a pixel lens in a display device according to the first embodiment.

FIG. 8 is a plan view of a display device according to the first embodiment. FIG. 9 is a cross-sectional view taken along line A-A' of FIG. 8 according to one embodiment. FIG. 10 is a plan view illustrating an arrangement of a pixel, an aperture, and a pixel lens in a display device according to the first embodiment.

With reference to FIGS. 8 to 10, the display device 1 according to the first embodiment may include a substrate 110, a pixel 10, and a lens assembly 160 disposed on the pixel.

The substrate 110 includes a share area SA and a privacy area PA. The share area SA and privacy area PA may each include a plurality of pixels 10.

The pixel 10 may be one of the pixels 10 and 20 described with reference to FIGS. 1 to 7. Hereinafter, a description is made of the display device 1 including the pixel 10 according to the first embodiment.

The TFT array layer 120 is formed on the substrate 110. The TFT array layer 120 is formed with components to drive the pixel 10. The TFT array layer 120 may include a drive transistor for controlling drive current to be supplied to the light emitting element layer 130 to be described later, at least one switching transistor, and at least one capacitor.

The pixels 10 may display one of the blue (B), red (R), and green (G) colors, for example, and one unit pixel may be composed of three pixels 10 displaying blue (B), red (R), and green (G) colors, respectively.

The light emitting element layer 130 is formed on the TFT array layer 120. The light emitting element layer 130 may include a first electrode layer 131, a second electrode layer 132, and a light emitting layer 133 interposed therebetween.

The first electrode layer 131 is formed on the TFT array layer 120. In an embodiment, the first electrode layer 131 may be composed of patterned areas corresponding to each pixel 10.

The light emitting layer 133 is formed on the first electrode layer 131. The light emitting layer 133 may be formed to cover two or more pixels 10. For example, the light emitting layer 133 may be formed as a wide plate covering the first electrode layer 131 on the substrate 110.

The second electrode layer 132 is formed on the light emitting layer 133. The second electrode layer 132 may be formed as a wide plate to cover the light emitting layer 133.

A reflective layer 140 is formed on the light emitting element layer 130. The reflective layer 140 may include a plurality of apertures 141.

In an embodiment, an aperture 141 may have a smaller area than the pixel 10 and may be arranged such that a portion or the entire area of the aperture 141 overlaps the pixel 10. In an embodiment, the aperture 141 and the pixels 10 may have a 1:1 correspondence relationship as illustrated, such that one aperture 141 may be arranged to overlap one pixel 10. Alternatively, in another embodiment, a plurality of apertures 141 may be arranged to overlap one pixel 10.

A thin film encapsulation layer 150 is interposed between the light emitting element layer 130 and the reflective layer 140.

A lens assembly 160 is formed on the reflective layer 140. The lens assembly 160 may include a plurality of pixel lenses 161. The pixel lenses 161 are arranged adjacent to each other at regular intervals.

The light passing through the aperture 141 of the reflective layer 140 transmits through the passivation layer 170 and then travels to the pixel lens 161 aligned with the aperture 141. The light is refracted by the pixel lens 161 and is emitted outward. Dispersing or converging light, the pixel lens 161 makes it possible to control the viewing angle to the sides of the display device 1.

In detail, in the share area SA, the pixel lens 161 (first pixel lens) may be polygonal in shape with a polygonal cross-section. For example, in the share area SA, the pixel lens 161 may be pyramidical in shape with a triangular cross-section. This type of pixel lens 161 may disperse the light incident thereon in the share area SA, resultantly opening the viewing angle to the front and sides of the display device 1.

In the privacy area PA, the pixel lens 161 (second pixel lens) may be a lens having a semicircular cross-section. For example, each pixel lens 161 may have a flat bottom surface and a hemispherical top surface facing the reflective layer 140. This type of pixel lens 161 may refract the light incident thereon toward the front (upward) in the privacy area PA, resultantly opening the viewing angle to the front of the display device 1 while limiting the viewing angle to the sides of the display device 1.

During the operation of the display device 1, the opening or limitation of the viewing angle to the sides may be controlled by selectively driving the pixels 10 arranged in the privacy area PA or the share area SA. Accordingly, the display device 1 may be implemented to switch between the privacy mode or the share mode.

In an embodiment, the pixel lenses 161 may have a larger area than the apertures 141 formed in the reflective layer 140 and each of the pixel lenses 161 may be arranged to cover at least one aperture 141. That is, the apertures 141 may be arranged to overlap the pixel lenses 161 and, for example, the centers of the apertures 141 may be located within the pixel lenses 161.

In an embodiment, the apertures 141 and the pixel lenses 161 may have a 1:1 correspondence relationship, and one aperture 141 may be arranged to overlap one pixel lens 161. However, this embodiment is not limited thereto, and multiple apertures 141 may be arranged to overlap one pixel lens 161 in various embodiments.

In an embodiment, the pixel lenses 161 may have a smaller area than the pixels 10 and may be arranged such that a portion or the entire area of the apertures 141 overlaps the pixels 10.

Assuming that the guide structure is not applied to the pixel 10, when the pixel 10 is larger than the pixel lens 161, some of the light emitted from the pixel 10 may not reach the pixel lens 161 and may be dispersed due to the gap between the pixel lenses 161 and other factors. As a result, the reduced light focusing efficiency for the pixel lenses 161 may fail to properly implement an operation mode (e.g., privacy mode) of the display device 1.

When the guide structure is applied, even though the pixel 10 is larger than the pixel lens 161, the light emitted from the pixel 10 may be focused onto the pixel lens 161 via the reflective layer 140. Therefore, the light focusing efficiency onto the pixel lenses 161 for the light generated from the light emitting layer 133 may be increased, and the overall brightness may be increased by securing sufficient pixel area.

In an embodiment, the light focusing efficiency of the pixel lenses 161 using the optical guide may be determined by the first distance G1 between the top surface of the substrate 110 and a bottom surface of the reflective layer 140, the diameter W1 of the apertures 141, and the optical reflectance of the reflective layer 140. Therefore, by appropriately selecting these conditions, it is possible to efficiently control the required viewing angle and pixel area (resolution) in the display device 1.

The lens assembly 160 further includes a lens cover layer 162 that covers the pixel lenses 161. The lens cover layer 162 may prevent the pixel lenses 161 from damage caused by external impact. The lens cover layer 162 may completely cover the curved surface of the pixel lenses 161. The lens cover layer 162 may make the upper surface of the lens assembly 160 flat by eliminating irregularities caused by the pixel lenses 161. The lens cover layer 162 may include an insulating material. The lens cover layer 162 may have a lower refractive index than the pixel lenses 161.

In an exemplary embodiment, the first distance G1 between the top surface of the substrate 110 and the reflective layer 140 (e.g., the aperture 141) and the second distance G2 between the reflective layer 140 and the bottom surface of the lens assembly 160 (e.g., the pixel lenses 161) may have a relationship of Equation 1.

$$G2 \geq \alpha \times (W2+W1)/2 \quad \text{Equation 1}$$

where α is an arbitrary number greater than or equal to 0.2, W1 is the first diameter of the aperture 141, and W2 is the second diameter of the pixel lens 161.

A passivation layer 170 is interposed between the reflective layer 140 and the lens assembly 160. The passivation layer 170 may protect the underlying components, prevent penetration of moisture or oxygen from the outside, and flatten the top surface of the display device 1. The passivation layer 170 may be composed of an inorganic film or an organic film. The passivation layer 170 may be an inorganic film formed with at least one of silicon nitride, aluminum nitride, zirconium nitride, titanium nitride, hafnium nitride, tantalum nitride, silicon oxide, aluminum oxide, and titanium oxide. Alternatively, the passivation layer 170 may be an organic film formed with an organic material, for example, at least one of acrylic resin, epoxy resin, phenolic resin, polyamide resin, benzocyclobutene-based resin, or polyimide resin.

Figure 11:
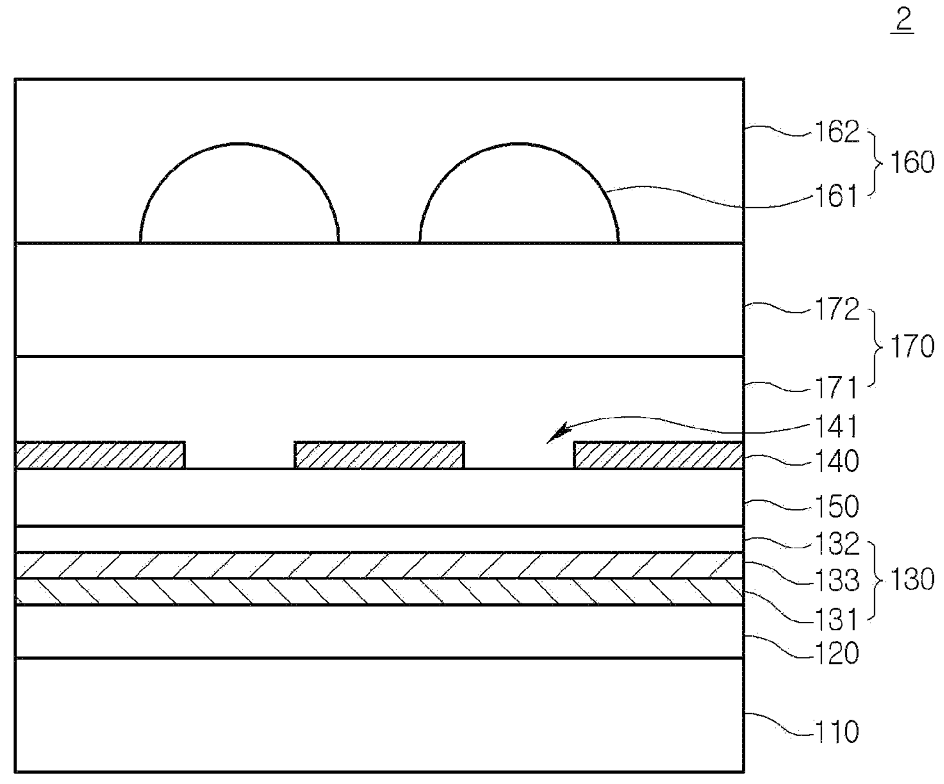
FIG. 11 is a cross-sectional view of a display device according to the second embodiment.

FIG. 11 is a cross-sectional view of a display device according to the second embodiment.

In describing the display device 2 according to the second embodiment, detailed descriptions of the components identical to or overlapping with those of the display device 1 of the first embodiment described with reference to FIGS. 8 to 10 are omitted.

With reference to FIG. 11, the passivation layer 170 may be composed of a multilayer structure including a first passivation layer 171 and a second passivation layer 172. The first passivation layer 171 and the second passivation layer 172 may be composed of inorganic or organic films. As an inorganic film, at least one of silicon nitride, aluminum nitride, zirconium nitride, titanium nitride, hafnium nitride, tantalum nitride, silicon oxide, aluminum oxide, and titanium oxide may be used. As an organic film, at least one of organic materials, for example, acrylic resin, epoxy resin, phenolic resin, polyamide resin, benzocyclobutene-based resin, or polyimide resin, may be used.

The first passivation layer 171 and the second passivation layer 172 may be composed of the same or different materials. For example, the first passivation layer 171 may be formed of an inorganic film, while the second passivation layer 172 may be formed of an organic film. The opposite is also possible. However, this embodiment is not limited thereto.

Even when the passivation layer 170 is composed of multiple layers, the reflective layer 140 and the lens assembly 160 of the display device 2 may be formed to meet the conditions of Equation 1. In this case, the distance between the lower surfaces of the reflective layer 140 and the lens assembly 160 may be equal to the sum of the thicknesses of the first and second passivation layers 171 and 172. The first and second passivation layers 171 and 172 may be identical in thickness to each other.

Figure 12:
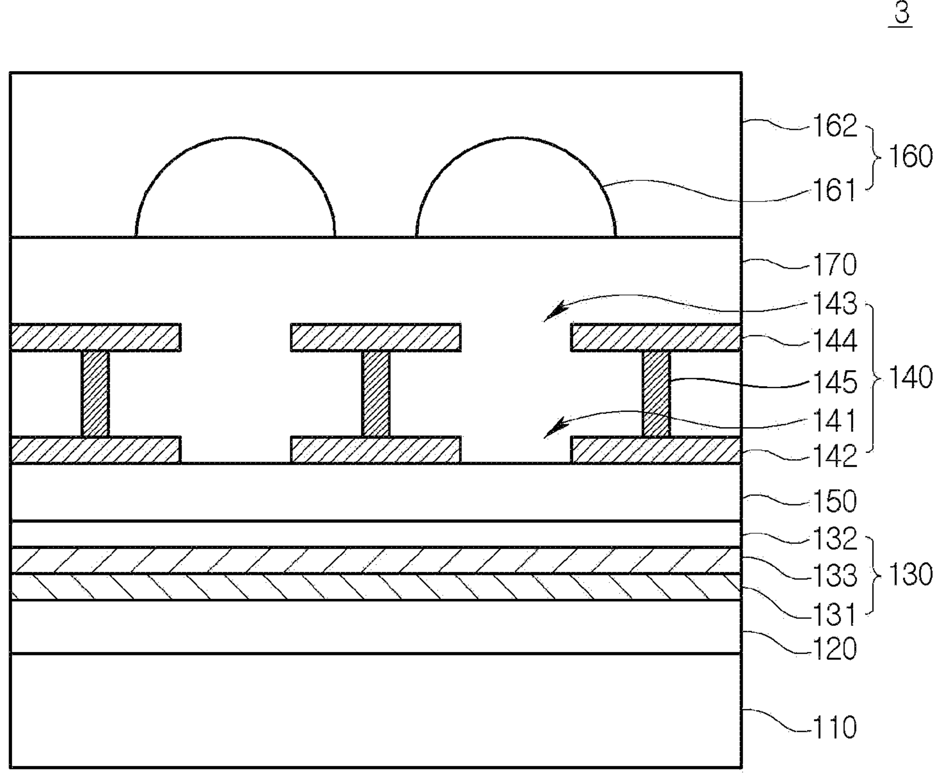
FIG. 12 is a cross-sectional view of a display device according to a third embodiment.
Figure 13:
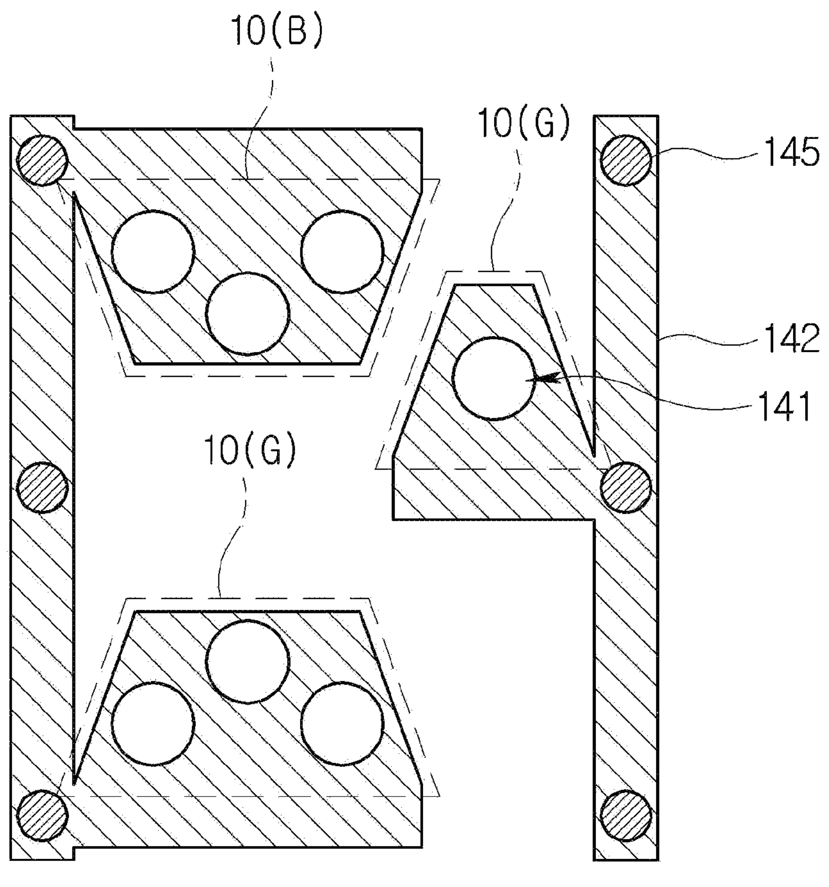
FIG. 13 is a plan view illustrating a first reflective layer of FIG. 12 according to one embodiment.
Figure 14:
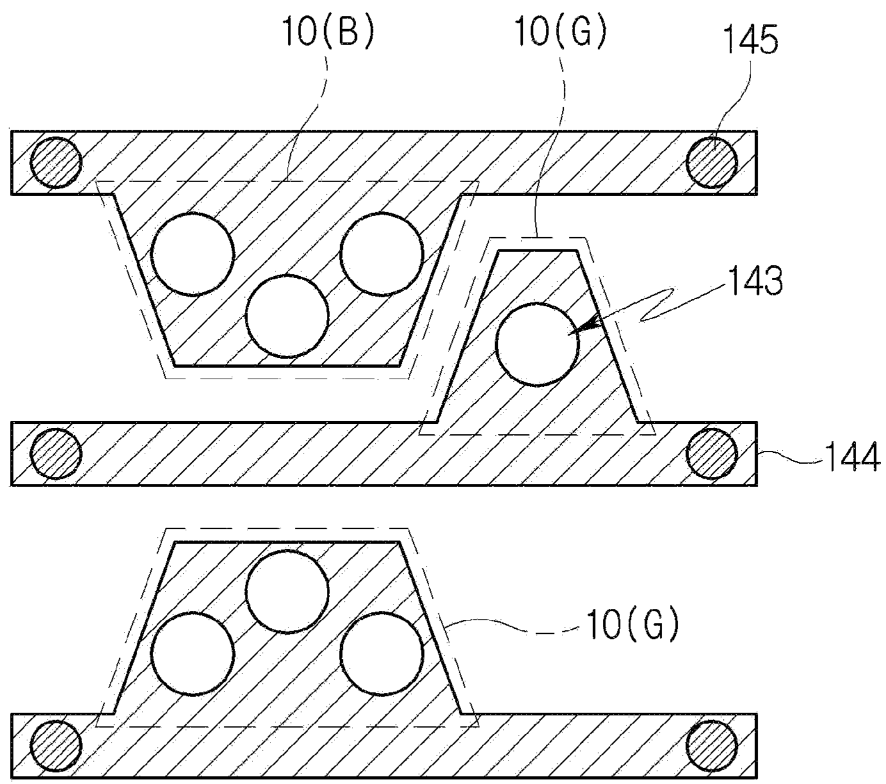
FIG. 14 is a plan view illustrating a second reflective layer of FIG. 12 according to one embodiment.

FIG. 12 is a cross-sectional view of a display device according to a third embodiment. FIG. 13 is a plan view illustrating a first reflective layer of FIG. 12 according to one embodiment. FIG. 14 is a plan view illustrating a second reflective layer of FIG. 12 according to one embodiment.

In describing the display device 3 according to the third embodiment, detailed descriptions of the components identical to or overlapping with those of the display device 1 of the first embodiment described with reference to FIGS. 8 to 10 are omitted.

With reference to FIGS. 12 to 14, the reflective layer 140 may include a first reflective layer 142, a second reflective layer 144 disposed on the first reflective layer 142, and a bridge 145 connecting the first and second reflective layers 142 and 144 in a vertical direction.

The first reflective layer 142 is formed on the light emitting element layer 130 with a thin film encapsulation layer 150 interposed therebetween. The first reflective layer 142 may include a plurality of first apertures 141. The first apertures 141 may be formed at predetermined intervals in the first reflective layer 142. The first reflective layer 142 may be patterned to have a predetermined shape with the first apertures 141. In an embodiment, at least one region of the first reflective layer 142 may be patterned in a bar shape elongated in a direction (e.g., column direction).

The second reflective layer 144 may be disposed on the first reflective layer 142. The second reflective layer 144 may include a plurality of second apertures 143. The second apertures 143 may be formed at predetermined intervals in the second reflective layer 144. The second reflective layer 144 may be patterned to have a predetermined shape with the second apertures 143. At least one region of the second reflective layer 144 may be patterned in a bar shape elongated in a direction (e.g., row direction) perpendicular to the first reflective layer 142.

The second apertures 143 may be arranged to overlap the first apertures 141 at least partially or entirely. In addition, patterns of the first reflective layer 142 and the second reflective layer 144 may be arranged to overlap at least partially or entirely in the whole area. For example, when the first reflective layer 142 has a bar shape elongated in the column direction and the second reflective layer 144 has a bar shape elongated in the row direction, the first reflective layer 142 and the second reflective layer 144 may overlap each other in the intersecting area.

The first and second reflective layers 142 and 144 may be electrically connected via a bridge 145. The bridge 145 may be formed in the overlapping region of the first and second reflective layers 142 and 144.

The reflective layer 140 may be covered by the passivation layer 170. The passivation layer 170 may protect the underlying components, prevent penetration of moisture or oxygen from the outside, and flatten the top surface of the display device 3. The passivation layer 170 may cover the reflective layer 140 and fill the space between the first and second reflective layers 142 and 144, insulating the surfaces of the first and second reflective layers 142 and 144.

In this embodiment, the reflective layer 140 may function as a light guide and simultaneously as a touch sensor. The touch sensor may use a capacitance-based touch sensing method capable of sensing touch in a mutual-capacitance-based touch sensing manner and a self-capacitance-based touch sensing manner.

The first and second reflective layers 142 and 144 may be used as touch electrodes. In the mutual-capacitance-based touch sensing method, the first and second reflective layers 142 and 144 may serve as sensing electrodes that generate touch sensing signals by forming capacitance with other adjacent first and second reflective layers 142 and 144. In the self-capacitance-based touch sensing method, the first and second reflective layers 142 and 144 may serve both as driving electrodes and sensing electrodes.

The display device 3 may sense touch and/or touch position based on the touch sensing signals generated from the reflective layer 140.

In this embodiment, the display device 3 may be minimized in thickness by configuring the reflective layer to serve as both a light guide and a touch sensor.

Figure 15:
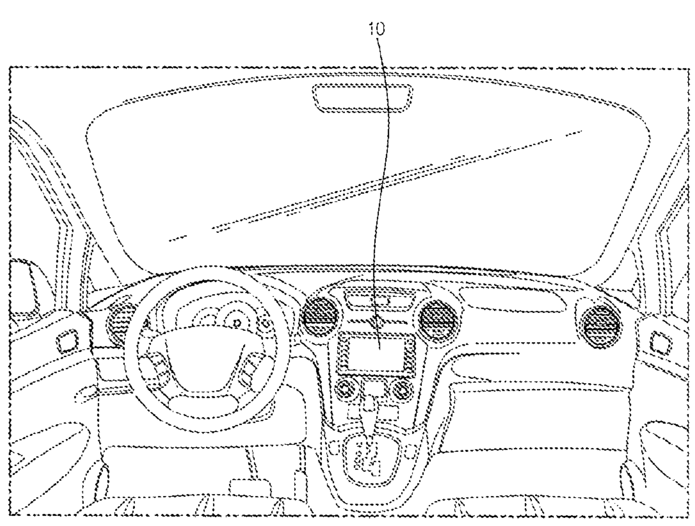
FIG. 15 is a diagram illustrating an example in which a display device according to an embodiment is applied.

FIG. 15 is a diagram illustrating an example in which a display device according to an embodiment is applied.

With reference to FIG. 15, the display device 1 according to an embodiment may be installed inside a vehicle. The display device 1 may be provided integrally or detachably on the dashboard of a vehicle.

In the embodiment, the display device 1 may display graphical user interfaces (GUIs) corresponding to navigation, video content, and audio content in response to the operating status and/or user requests.

In an embodiment, the display device 1 may operate in privacy mode while the vehicle is in operation. For example, the display device 1 may operate in privacy mode when displaying videos or other content that may be deemed distracting to the user while driving.

In an embodiment, the display device 1 may operate in a share mode during non-driving periods of the vehicle. The display device 1 may also operate in the share mode even while the vehicle is in operation. For example, the display device 1 may operate in the share mode when displaying videos that are deemed to assist the user's driving, such as navigation.

A pixel and a viewing angle control display device including the pixel according to embodiments is capable of improving the efficiency of a pixel lens.

A pixel and a viewing angle control display device including the pixel is capable of improving central luminance of each pixel by overcoming luminance reduction by a pixel lens.

Although embodiments of this invention have been described above with reference to the accompanying drawings, it will be understood that the technical configuration of this invention described above can be implemented in other specific forms by those skilled in the art without changing the technical concept or essential features of the present invention. Therefore, it should be understood that the embodiments described above are exemplary and not limited in all respects. Furthermore, the scope of the present invention is defined by the claims set forth below, rather than the detailed description above. In addition, it should be understood that all modifications or variations derived from the meaning and scope of the claims and their equivalent concept are included within the scope of this invention.

What is claimed is:

1. A viewing angle control display device comprising:

a substrate;

a plurality of pixels on the substrate;

a lens assembly on the plurality of pixels, the lens assembly comprising a plurality of pixel lenses;

a reflective layer including a plurality of apertures formed in the reflective layer, wherein a pixel of the plurality of pixels comprises:

a thin film transistor (TFT) array layer on a substrate, the TFT array layer comprising circuit elements; and a light emitting element layer on the TFT array layer, the light emitting element layer comprising a first electrode layer, a second electrode layer, and a light emitting layer between the first electrode layer and the second electrode layer, wherein the reflective layer is disposed on the light emitting element layer, wherein the pixel overlaps one aperture of the plurality of apertures without overlapping any other aperture of the plurality of apertures in a plan view of the pixel, and wherein the light emitting layer generates light that is guided by the reflective layer such that the light is emitted through an aperture of the plurality of apertures, and wherein the viewing angle control display device further comprises:

a thin film encapsulation layer between the light emitting element layer and the reflective layer, the thin film encapsulation layer comprising an inorganic thin film or an organic thin film; and a passivation layer between the lens assembly and the reflective layer.

2. The viewing angle control display device of claim 1, wherein the plurality of apertures have a smaller area than the plurality of pixel lenses and overlap the plurality of pixel lenses at least partly or entirely, and each of the plurality of pixel lenses has a smaller area than the plurality of pixels.

3. The viewing angle control display device of claim 1, wherein the first electrode layer comprises a reflective electrode, the second electrode layer comprises a transparent electrode, and the light is guided between the first electrode layer and the reflective layer and emitted through the aperture of the plurality of apertures.

4. The viewing angle control display device of claim 1, further comprising:

a lower reflective layer beneath the substrate, wherein the first electrode layer and the second electrode layer comprise a transparent electrode, and the light is guided between the lower reflective layer and the reflective layer and emitted through the aperture of the plurality of apertures.

5. The viewing angle control display device of claim 1, wherein the passivation layer comprises a multilayer comprising at least one of an inorganic thin film and an organic thin film.

6. The viewing angle control display device of claim 1, wherein the plurality of apertures have a first diameter, the plurality of pixel lenses have a second diameter, and a first distance between a top surface of the substrate and the reflective layer and a second distance between the reflective layer and a bottom surface of the lens assembly have a relationship of Equation 1:

$$G2 \geq \alpha \times (W2+W1)/2$$

where $\alpha$ is a number greater than or equal to 0.2, W1 is the first diameter, W2 is the second diameter, G2 is the second distance.

7. The viewing angle control display device of claim 1, wherein the reflective layer comprises:

a first reflective layer patterned in a predetermined shape with first apertures;

a second reflective layer on the first reflective layer, the second reflective layer patterned in a predetermined shape with second apertures; and a bridge electrically connecting the first reflective layer and the second reflective layer.

8. The viewing angle control display device of claim 7, wherein the first reflective layer is patterned, at one region thereof, in a bar shape elongated in one direction, and the second reflective layer is patterned, at one region thereof, in a bar shape elongated in another direction perpendicular to the one direction.

9. The viewing angle control display device of claim 7, wherein the first reflective layer and the second reflective layer at least partly overlap and configured to sense touch based on capacitance between the first reflective layer and the second reflective layer.

10. The viewing angle control display device of claim 1, wherein the substrate comprises a privacy area and a share area comprising at least one pixel, and the plurality of pixel lenses are hemispherical in shape in the privacy area to reflect and emit incident light upward and pyramidical in shape in the share area to disperse and emit the incident light.

11. The viewing angle control display device of claim 10, wherein the privacy area is configured to open a viewing angle to a front of the viewing angle control display device and limit to sides of the viewing angle control display device via a pixel lens of the plurality of pixel lenses based on at least one pixel of the plurality of pixels emitting light in the privacy area, and the share area is configured to open the viewing angle to both the front and the sides via the plurality of pixel lenses based on at least one pixel of the plurality of pixels emitting light in the share area.

12. The viewing angle control display device of claim 10, wherein one of the at least one pixel of the privacy area and the at least one pixel of the share area is selectively driven to operate a privacy mode and a share mode.

* * * * *